United States Patent
Kanehira

(10) Patent No.: US 6,994,586 B2
(45) Date of Patent: Feb. 7, 2006

(54) PRINTED CIRCUIT BOARD SUPPORTING STRUCTURE

(75) Inventor: Takaharu Kanehira, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 11/127,783

(22) Filed: May 12, 2005

(65) Prior Publication Data

US 2005/0260888 A1  Nov. 24, 2005

(30) Foreign Application Priority Data

May 12, 2004  (JP) .............................. 2004-142592

(51) Int. Cl.
*H01R 13/73* (2006.01)
(52) U.S. Cl. .................. 439/564; 439/573; 174/138 G; 174/138 D
(58) Field of Classification Search ................ 439/564, 439/573; 174/138 G, 138 D
See application file for complete search history.

(56) References Cited

U.S. PATENT DOCUMENTS

| | | | | |
|---|---|---|---|---|
| 5,786,989 A | * | 7/1998 | Kawabe ................... | 174/138 G |
| 6,280,202 B1 | * | 8/2001 | Alden et al. ............ | 174/138 D |
| 6,560,119 B1 | * | 5/2003 | Katsuyama et al. .... | 174/138 G |

FOREIGN PATENT DOCUMENTS

| | | |
|---|---|---|
| JP | 1-160882 | 11/1989 |
| JP | 2000-216565 | 8/2000 |
| JP | 2002-217502 | 8/2002 |
| JP | 2002-299860 | 10/2002 |

OTHER PUBLICATIONS

Patent Abstracts of Japan, Publication No. 2002-299860; Publication Date Oct. 11, 2002, 1 page.
Patent Abstracts of Japan, Publication No. 2000-216565; Publication Date Aug. 4, 2000; 1 page.
Patent Abstracts of Japan, Publication No. 2002-217502, Publication Date Aug. 2, 2002, 1 page.

* cited by examiner

*Primary Examiner*—Tho D. Ta
(74) *Attorney, Agent, or Firm*—Osha Liang LLP

(57) ABSTRACT

A printed circuit board supporting structure includes a printed circuit board, a board support constituted by a conductor, and a clamping device that clamps and fixes the printed circuit board to the board support, a solder bump pattern provided on a board surface of the printed circuit board being brought into contact with an obverse surface of the board support at a portion clamped to electrically conduct with the board support. A portion adjacent to a portion where the solder bump pattern is formed on the printed circuit board is placed on a reference supporting surface provided in continuation from the board support and adapted to restrict a reference position of the printed circuit board. The portion is clamped to a clamping piece provided in continuation from the board support, and an obverse surface of the clamping piece is brought into pressure contact with the solder bump pattern.

7 Claims, 4 Drawing Sheets

PRINTED CIRCUIT BOARD SUPPORTING STRUCTURE

BACKGROUND OF THE INVENTION

1. Field of the Invention

The present invention relates to a printed circuit board supporting structure, and more particularly to a printed circuit board supporting structure in which a solder bump pattern provided on a board surface of a printed circuit board is brought into contact with an obverse surface of a board support constituted by a conductor such as a chassis and is made electrically conductive therewith, and in which the printed circuit board is fixed to the board support at a portion of contact between the solder bump pattern and the board support.

2. Description of the Related Art

Conventionally, a board fixing device has been known for facilitating the removal of a board from a chassis when an apparatus is disassembled (e.g., refer to JP-A-2002-299860). In addition, as a method of fixing a printed board on a mounting board, a method has been known in which the printed board is clamped by a clamping piece and a base portion of a mounting device mounted on the mounting board by the use of a tightening force of a screw, or a method in which the printed board is screwed down to a mounting piece formed in a mounting board by being cut out (e.g., refer to JP-UM-A-1-160882).

Meanwhile, a structure for connecting a circuit board to chassis ground has been known in which, when the circuit board is fastened and fixed to the chassis ground by using a fixing screw, solder formed on the circuit board is brought into pressure contact with the chassis ground at a fastening and fixing portion (e.g., refer to JP-A-2000-216565). In addition, a structure has also been known in which a printed circuit board provided with grounding solder around a mounting hole is screwed down to a boss provided on a chassis (e.g., refer to JP-A-2002-217502).

In a case where a printed circuit board supporting structure is adopted in which the printed circuit board is supported by and fixed to a board support such as a metal chassis at a plurality of portions, and the printed circuit board and the metal chassis are electrically connected at these fixing portions, there have been cases where the structure shown in FIGS. 6 and 7 is adopted. In the printed circuit board supporting structure shown in the drawings, a screw insertion hole 12 and a solder bump pattern 2 formed around its periphery on a board surface are provided on each corner portion of a printed circuit board 1. Meanwhile, a board support 4 is provided on a metal chassis 3, and a headed clamp screw 5 inserted in the screw insertion hole 12 of the printed circuit board 1 placed on the board support 4 is screwed and tightened in a threaded hole 41 provided in the board support 4. By making use of the tightening force of the headed clamp screw 5 of such a measure that the respective solder 21 of the solder bump pattern 2 is crushed, the solder bump pattern 2 and the obverse surface of the board support 4 are brought into pressure contact with each other while a gap S is being secured between the printed circuit board 1 and the board support 4, thereby allowing the printed circuit board 1 and the board support 4 to be electrically conductive.

According to this printed circuit board supporting structure, there are advantages in that the screwing down of the printed circuit board 1 to the board support 4 and the making of the printed circuit board 1 electrically conductive with the board support 4 are realized simultaneously, and that reliability in electrical continuity and stability in electrical continuity improve.

However, if the printed circuit board supporting structure explained with reference to FIGS. 6 and 7 is applied to a plurality of portions of the printed circuit board 1, e.g., the respective ones of the four corner portions of the rectangular printed circuit board 1, there are cases where variations occur in the gap S between the printed circuit board 1 and the board support 4 owing to such as variations in the tightening torque based on the headed clamp screw 5 and variations in the height of the bump of the solder 21 of the solder bump pattern 2. If the variations occur in the gap S, even if the height of the board support 4 corresponding to the four corner portions of the printed circuit board 1 is in agreement with high accuracy, the dimensional accuracy in the mounting of the printed circuit board 1 declines, and warpage occurs in the printed circuit board 1, so that a bending stress is likely to remain.

Meanwhile, as the printed circuit board 1, one having a ball grid array (BGA) 6 mounted thereon, as shown in FIG. 8, is known. The BGA 6 has terminals and solder balls arrayed on its lower surface, and when it is mounted on the printed circuit board 1, the terminals and the conductor pattern of the printed circuit board 1 are connected by melting the solder balls. Therefore, if the printed circuit board 1 with the BGA 6 mounted thereon has been irregularly warped or deformed, there occurs the possibility that the BGA 6 floats up from the board surface of the printed circuit board 1 over time, resulting in the exfoliation or breakage of portions of connection between the terminals and the conductor pattern. This constitutes a factor causing the reliability of the apparatus to decline substantially. It should be noted that, in FIG. 8, reference character A denotes a mounting portion using the supporting structure explained with reference to FIG. 6, and reference numeral 12 denotes the screw insertion hole 12, and numeral 2 denotes the solder bump pattern.

In this respect, JP-A-2002-299860 and JP-UM-A-1-160882 merely provide structures for fixing the printed circuit board to the chassis or the like, while JP-A-2000-216565 and JP-A-2002-217502 merely cause the solder bump portions of the printed circuit board to electrically conduct with the board support by adopting structures similar to those explained with reference to FIG. 6 or 7. For these reasons, even if the techniques disclosed in these patent documents are combined in any way, it is impossible to prevent the warpage of the printed circuit board which can possibly occur in the case where the printed circuit board and the metal chassis are electrically connected at fixing portions of the printed circuit board with respect to the board support.

Accordingly, in the printed circuit board supporting structure explained with reference to FIGS. 6 and 7, it is conceivable to adopt a supporting structure in which the aforementioned gap S is prevented from occurring by directly superposing the lands on the board surface of the printed circuit board 1 on the board support 4 by omitting the solder bump patterns 2. If this structure is adopted, since the gap does not exist, there is an advantage in that the dimensional accuracy in the mounting of the printed circuit board 1 improves, making it difficult for the warpage to occur in the printed circuit board 1. On the contrary, however, there arises a disadvantage in that reliability in the electrical continuity and stability in electrical continuity between the printed circuit board 1 and the board support 4 decline. To compensate for this disadvantage, it has been practiced to establish electrical continuity with the board support 4 by means of separate parts such as lead wires from the printed circuit board 1. In such a case, however, there arise drawbacks in that the lead wires are additionally needed, and the number of parts and the number of steps in operation increase, resulting in higher manufacturing cost, and that since the electrical connection path becomes long, the connection impedance becomes high, resulting in a decline in electrical performance.

In addition, it has also been practiced to electrically connect a conductor pattern on the obverse surface of the printed circuit board having conductor patterns on both obverse and reverse surfaces thereof to a chassis by means of a metal screw. However, this also results in a relatively long electrical connection path, and there is a possibility of exerting an adverse effect on the connection impedance in a high-frequency region, in particular.

Accordingly, an object of the invention is to provide a printed circuit board supporting structure which makes it possible to eliminate the possibility of occurrence of warpage in the printed circuit board by basically adopting a supporting structure such as the one explained with reference to FIG. 6 or 7, which has the advantages that there is no need to use additional parts such as lead wires, an increase does not occur in the connection impedance, and no adverse effect is exerted on the connection impedance in the high-frequency region, i.e., a printed circuit board supporting structure in which the printed circuit board is clamped and fixed to the board support constituted by a conductor by means of a clamping device, and the solder bump pattern provided on the board surface of the printed circuit board is thereby brought into pressure contact with the obverse surface of the board support at that clamped portion.

SUMMARY OF THE INVENTION

The printed circuit board supporting structure in accordance with the invention is a printed circuit board supporting structure including a printed circuit board, a board support constituted by a conductor, and a clamping device for clamping and fixing the printed circuit board to the board support, a solder bump pattern provided on a board surface of the printed circuit board being brought into contact with an obverse surface of the board support at a portion clamped by the clamping device so as to electrically conduct with the board support, wherein a portion adjacent to a portion where the solder bump pattern is formed on the printed circuit board is placed on a reference supporting surface provided in continuation from the board support and adapted to restrict a reference position of the printed circuit board, and the portion where the solder bump pattern is formed on the printed circuit board is clamped to a clamping piece provided in continuation from the board support by means of the clamping device, such that an obverse surface of the clamping piece is brought into pressure contact with the solder bump pattern by a tightening force thereof.

In this construction, the dimensional accuracy in the mounting of the printed circuit board is maintained with high accuracy by the reference supporting surface with the printed circuit board placed thereon. In addition, since the obverse surface of the clamping piece clamped by the clamping device is brought into pressure contact with the solder bump pattern of the printed circuit board, with the result that the printed circuit board and the board support are reliably electrically connected by means of the clamping piece, thereby ensuring reliability in electrical continuity and stability in electrical connection. In other words, according to this construction, the effect of variations in the tightening torque based on the clamping device for reliably effecting electrical contact between the printed circuit board and the board support, as well as the effect of variations in the bump height of the solder bump pattern, are not exerted on the dimensional accuracy in the mounting of the printed circuit board. Accordingly, high reliability in electrical continuity and stability in electrical connection are ensured, and it becomes possible to reliably prevent the occurrence of warpage in the printed circuit board after mounting.

In the invention, it is possible to adopt a construction in which the clamping piece formed by punching a supporting piece having the reference supporting surface is disposed on a lower side of the supporting piece, and an obverse surface of the clamping piece is brought into pressure contact with the solder bump pattern disposed through an opening, which is formed as a punched space of the clamping piece formed in the supporting piece. According to this arrangement, the board support is separated into the clamping piece and the supporting piece having the reference supporting surface, and the solder bump pattern for reliably establishing and stabilizing electrical connection between the printed circuit board and the board support is brought into contact with the clamping piece alone. Hence, the effect of variations in the tightening torque based on the clamping device for reliably effecting electrical contact between the printed circuit board and the board support, as well as the effect of variations in the bump height of the solder bump pattern, are not exerted on the dimensional accuracy in the mounting of the printed circuit board. Accordingly, high reliability in electrical continuity and stability in electrical connection are ensured, and it becomes possible to reliably prevent the occurrence of warpage in the printed circuit board after mounting. In addition, since the clamping piece is formed by punching the supporting piece, there is no need to provide additional parts.

In the invention, it is possible to adopt a construction in which the clamping device is a headed clamp screw, the solder bump pattern is provided around a periphery of a screw insertion hole provided in an end portion of the printed circuit board, and the headed clamp screw inserted in the screw insertion hole is inserted and tightened in a threaded hole provided in the clamping piece, causing the clamping piece to be deformed and brought into pressure contact with the solder bump pattern. According to this construction, it merely suffices to alter the structure of the board support 4 in the printed circuit board supporting structure which has been described with reference to FIG. 6 or 7.

In the invention, deformation resistance strength of the clamping piece should preferably be made weaker than the deformation resistance strength of the supporting piece. According to this arrangement, by merely performing the step of tightening the clamping screw, the clamping piece whose deformation resistance strength is weaker than that of the supporting piece is deformed, and is brought into pressure contact with the solder bump pattern on the board surface of the printed circuit board placed on the reference supporting surface of the supporting piece.

As the means for making the deformation resistance strength of the clamping piece weaker than that of the supporting piece, it is possible to adopt, for example, a means in which the clamping piece is formed in a cantilevered manner, and a notched portion is provided in a root portion of the clamping piece to adjust an effective width of the root portion such that the deformation resistance strength of the clamping piece is made weaker than the deformation resistance strength of the supporting piece, or a means in which the supporting piece is provided with a reinforcing rib to reinforce the supporting piece, such that the deformation resistance strength of the clamping piece is made weaker than the deformation resistance strength of the supporting piece. It should be noted that the aforementioned notched portion may be formed in a recessed form or by a punched hole.

The printed circuit board supporting structure in accordance with the invention is further embodied by adopting the construction of a printed circuit board supporting structure including a printed circuit board, a board support constituted by a conductor, and a clamping device for clamping and fixing the printed circuit board to the board support, a solder bump pattern provided on a board surface of the printed circuit board being brought into contact with an obverse surface of the board support at a portion clamped by the clamping device so as to electrically conduct with the board support, wherein the clamping device is a headed clamp screw, the solder bump pattern being provided around a periphery of a screw insertion hole provided in a corner portion of the printed circuit board, a cantilevered supporting piece having a reference supporting surface for restricting a reference position of the printed circuit board being provided integrally with the board support constituted by a chassis, a cantilevered clamping piece formed by punching the supporting piece being disposed on a lower side of the supporting piece, the supporting piece being provided with a reinforcing rib to reinforce the supporting piece, and a recessed notched portion being provided in a root portion of the clamping piece to narrow an effective width of the root portion such that deformation resistance strength of the clamping piece is made weaker than the deformation resistance strength of the supporting piece, and wherein the headed clamp screw inserted in the screw insertion hole of the printed circuit board in which a periphery of a portion where the solder bump pattern is formed is placed on the reference supporting surface is inserted and tightened in a threaded hole provided in the clamping piece, and the clamping piece is deformably brought into pressure contact with the solder bump pattern disposed through an opening, which is formed as a punched space of the clamping piece formed in the supporting piece, by means of a tightening force thereof. The operation of this invention will be described in detail with reference to an embodiment which will be described later.

As described above, according to the invention, since a printed circuit board supporting structure is adopted in which the printed circuit board is clamped and fixed to the board support constituted by a conductor by means of a clamping device, and the solder bump pattern provided on the board surface of the printed circuit board is thereby brought into pressure contact with the obverse surface of the board support at that clamped portion, it is possible to provide a printed circuit board supporting structure having advantages in that there is no need to use additional parts such as lead wires, an increase does not occur in the connection impedance, and no adverse effect is exerted on the connection impedance in a high-frequency region. Furthermore, an outstanding advantage is offered in that the possibility of occurrence of warpage in the printed circuit board after mounting is eliminated, making it possible to readily improve the reliability of the apparatus. In addition, in the invention, a further advantage is offered in that by adopting the invention to a printed circuit board with a BGA mounted thereon, the possibility of occurrence of such as secular exfoliation of the BGA from the printed circuit board and the breakage of connected portions, which is due to the warpage of the printed circuit board, is eliminated.

DETAILED DESCRIPTION OF THE INVENTION

Figure 1:
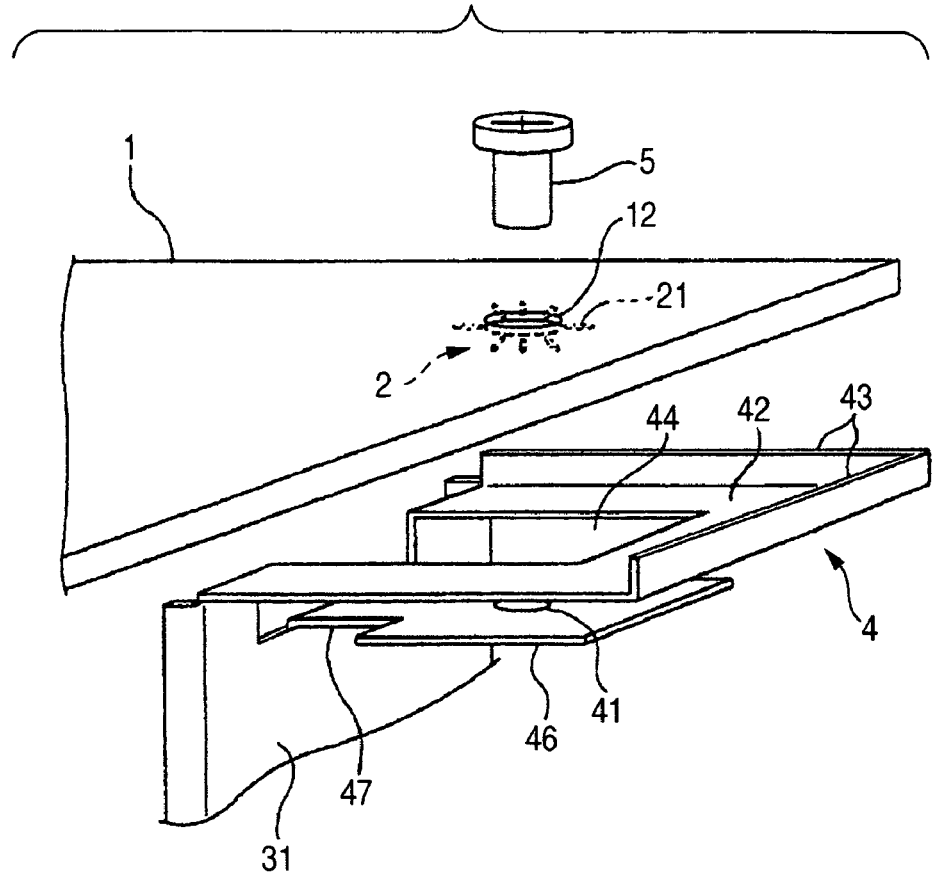
FIG. 1 is a schematic exploded perspective view illustrating an embodiment of a printed circuit board supporting structure in accordance with the invention.
Figure 2:
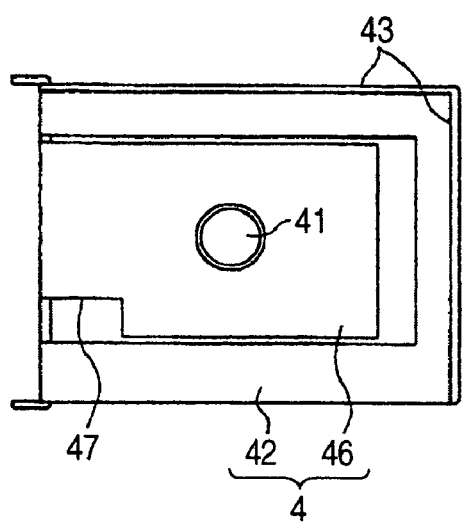
FIG. 2 is a plan view of a board support.
Figure 3:
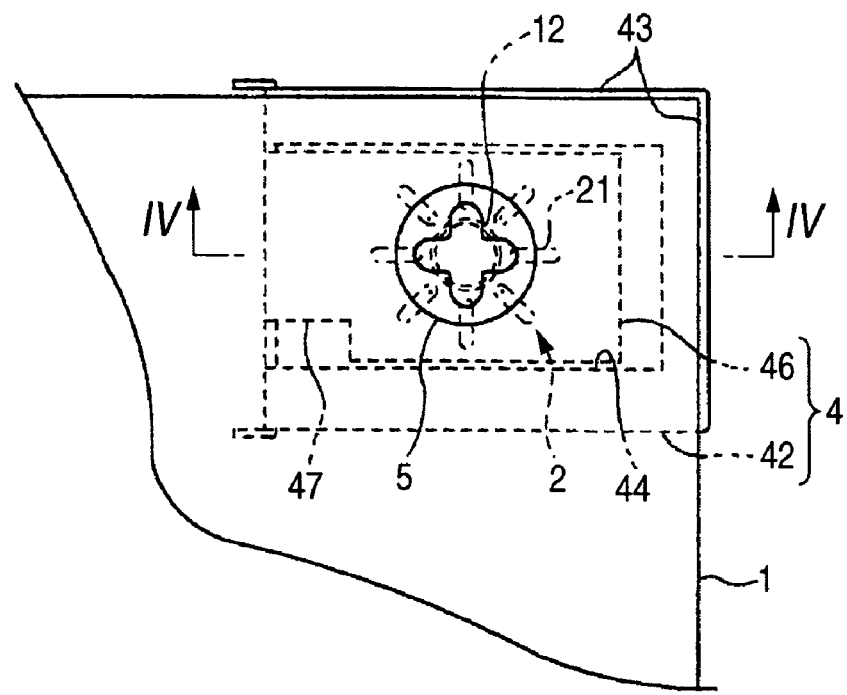
FIG. 3 is a schematic plan view of the printed circuit board supporting structure.
Figure 4:
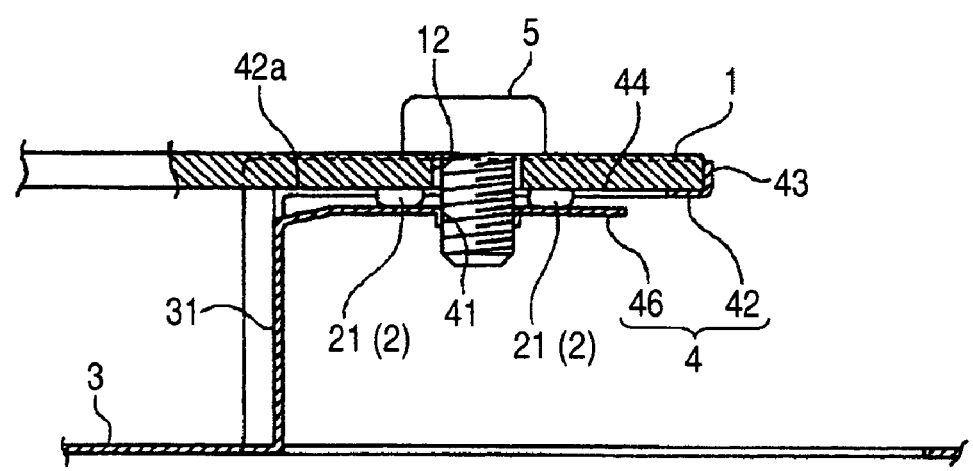
FIG. 4 is an enlarged cross-sectional view of a portion along line IV—IV of FIG. 3.
Figure 5:
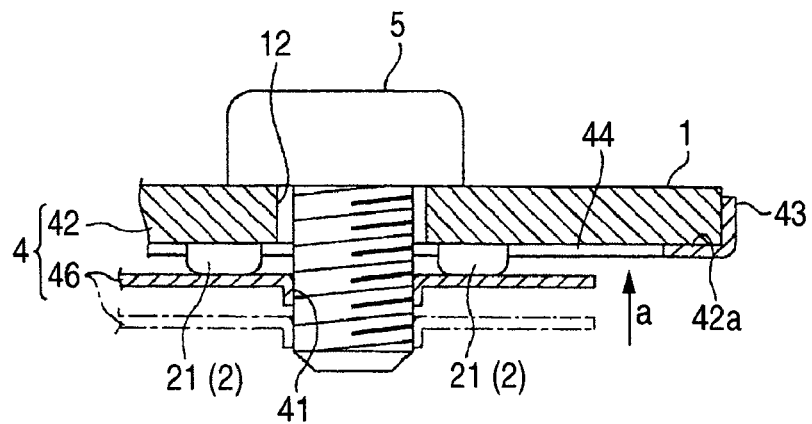
FIG. 5 is an enlarged view of an essential portion of FIG. 4.
Figure 6:
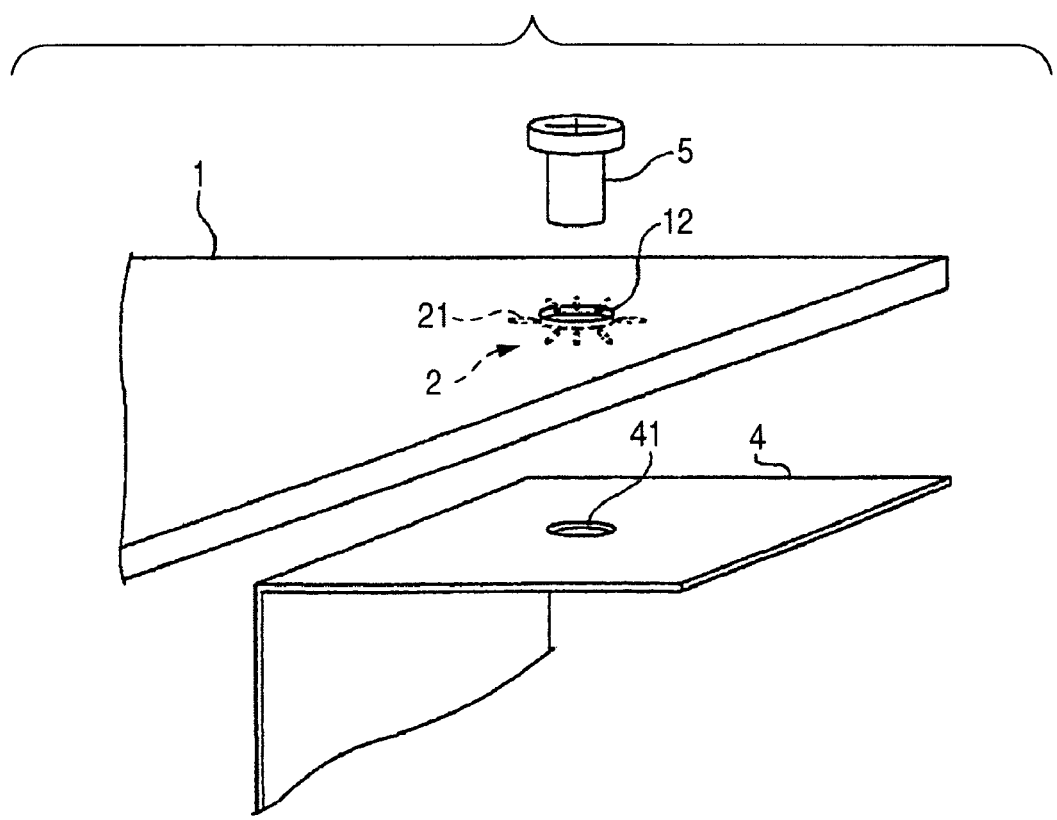
FIG. 6 is a schematic exploded perspective view of a printed circuit board supporting structure in accordance with a comparative example.
Figure 7:
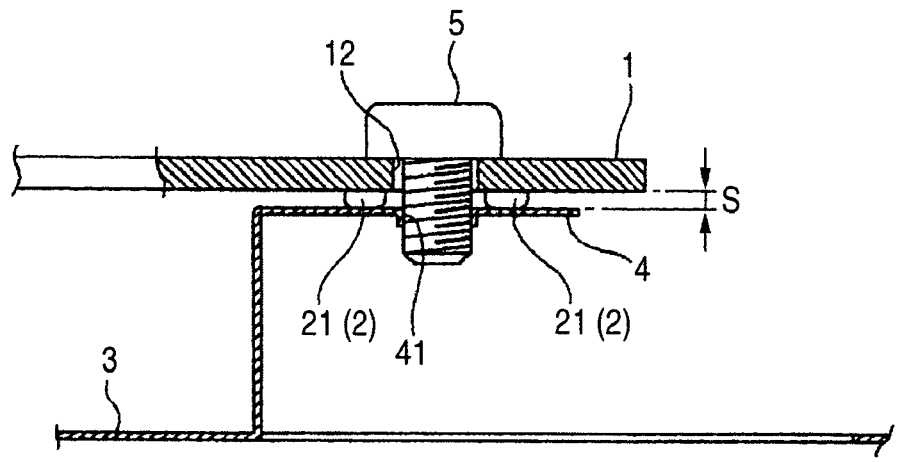
FIG. 7 is a side elevational view, partly in section, of the printed circuit board supporting structure in accordance with the comparative example.

FIG. 1 is a schematic exploded perspective view illustrating an embodiment of a printed circuit board supporting structure in accordance with the invention. FIG. 2 is a plan view of a board support 4. FIG. 3 is a schematic plan view of the printed circuit board supporting structure. FIG. 4 is an enlarged cross-sectional view of a portion along line IV—IV of FIG. 3. FIG. 5 is an enlarged view of an essential portion of FIG. 4.

As shown in FIG. 1, a screw insertion hole 12 is provided in a corner portion of a printed circuit board 1, and a solder bump pattern 2 is formed around a periphery of the screw insertion hole 12 on the board surface of the printed circuit board 1. This solder bump pattern 2 is formed on a land of a ground-connecting conductor pattern formed on the printed circuit board 1. Although, in the illustrated example, individual portions of solder 21 extend radially, the shape of the solder 21 may be a ring shape or a dotted shape surrounding the screw insertion hole 12, or may be another shape.

As shown in FIG. 4, a board support 4 is formed in a metal chassis 3 by being cut out, and includes a rectangular supporting piece 42 extending horizontally in a cantilevered manner from an upper end of a rising portion 31, as well as a substantially rectangular clamping piece 46 which is formed in a cantilevered manner by punching the supporting piece 42 and is disposed on the lower side of the supporting piece. The supporting piece has its upper surface formed as a flat reference supporting surface 42a (see FIG. 4 or 5). The arrangement provided is such that if the printed circuit board 1 is placed on that reference supporting surface 42a, the printed circuit board 1 is positioned with high accuracy. At the same time, the solder bump pattern 2 on the printed circuit board 1 placed on the reference supporting surface 42a is adapted to project downwardly through an opening 44, which is formed as a punched space of the clamping piece 46 formed in the supporting piece 42, and to oppose the clamping piece 46 from above. In addition, in the illustrated example, the deformation resistance strength of the clamping piece 46 is made weaker than the deformation resistance strength of the supporting piece 42. Namely, the supporting piece 42 has its deformation resistance strength increased by reinforcing ribs 43 bent upwardly at its two sides, whereas the clamping piece 46 has its deformation resistance strength weakened by adjusting the effective width of its root portion by providing a recessed notched portion 47 in a portion of the root portion. In addition, the clamping piece 46 is provided with a threaded hole 41 for screwing in a headed clamp screw 5.

Then, as shown in FIGS. 3 and 4, the headed clamp screw 5 is inserted into the screw insertion hole 12 in the printed circuit board 1 placed on the reference supporting surface 42a of the supporting piece 42, and the headed clamp screw 5 is screwed into and tightened in the threaded hole 41 in the clamping piece 46. In addition, as indicated by arrow a in FIG. 5, the clamping piece 46 is deformed from the position of the phantom line to the position of the solid line by the tightening force of the headed clamp screw 5, so as to be brought into pressure contact with the solder bump pattern 2. The tightening torque of the headed clamp screw 5 in this case is of such strength that the solder 21 of the solder bump pattern 2 with the clamping piece 46 brought into pressure contact therewith is slightly crushed. If the tightening torque is set to be of such strength, the printed circuit board 1 is reliably brought into electrical contact with the clamping piece 46 through the solder bump pattern 2, so that satisfactory reliability in electrical continuity and stability in electrical connection are ensured.

Figure 8:
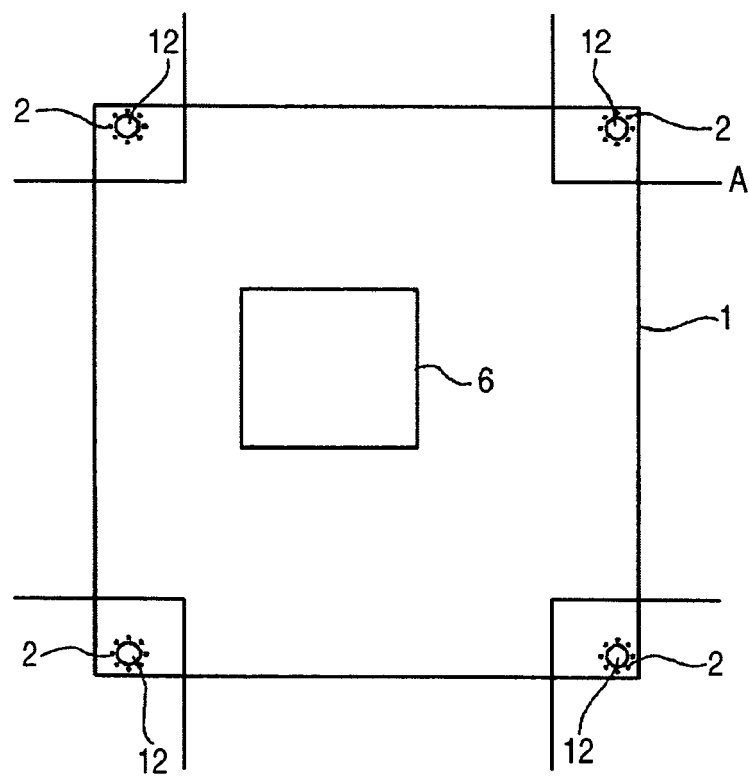
FIG. 8 is a schematic plan view of a printed circuit board with a BGA mounted thereon.

According to this embodiment, in addition to the fact that the dimensional accuracy in the mounting of the printed circuit board is maintained with high accuracy by the reference supporting surface 42a of the supporting piece 42 with the printed circuit board 1 placed thereon, the obverse surface of the clamping piece 46 clamped by the headed clamp screw 5 is brought into pressure contact with the solder bump pattern 2 of the printed circuit board 1, thereby ensuring reliability in electrical continuity and stability in electrical connection. For this reason, in a case where a plurality of portions of the printed circuit board 1, e.g., four corner portions of the rectangular printed circuit board 1, are supported by the board supports 4 having the above-described construction, even if there are variations in the tightening torque based on the headed clamp screw 5 for reliably effecting electrical contact between the printed circuit board 1 and the board support 4, or even if there are variations in the bump height of the solder bump pattern 2, their effects are not exerted on the dimensional accuracy in the mounting of the printed circuit board 1 after mounting. Accordingly, high reliability in electrical continuity and stability in electrical connection are ensured, and the possibility of the occurrence of warpage in the printed circuit board 1 after mounting is eliminated. For this reason, as explained with reference to FIG. 8, even if the printed circuit board 1 has a BGA 6 mounted thereon, the possibility of occurrence of such as secular exfoliation of the BGA 6 from the printed circuit board 1 and the breakage of connected portions, which is due to the warpage of the printed circuit board 1, is eliminated.

In this embodiment, as a means for making the deformation resistance strength of the clamping piece 46 weaker than that of the supporting piece 42, a means is adopted in which the supporting piece 42 is reinforced by the reinforcing ribs 43 to increase its deformation resistance strength, while the recessed notched portion 47 is provided in a portion of the root portion of the clamping piece 46. However, this means is not limited to that of the embodiment. For example, even if the supporting piece 42 is not provided with the reinforcing ribs 43, by merely making the effective width of the root portion of the supporting piece 42 wider than the effective width of the root portion of the clamping piece 46, the deformation resistance strength of the clamping piece 46 can be made weaker than that of the supporting piece 42. Still alternatively, by merely providing the reinforcing ribs 43 on the supporting piece 42, or by merely narrowing the effective width of the root portion of the clamping piece 46, the deformation resistance strength of the clamping piece 46 can be made weaker than that of the supporting piece 42.

In addition, although in this embodiment the headed clamp screw 5 has been illustrated as one example of the clamping device, another fastening device, such as a clamp bolt and nut, a caulking pin, or the like can be used as the clamping device.

What is claimed is:

1. A printed circuit board supporting structure comprising:
   a printed circuit board;
   a board support constituted by a conductor; and
   a clamping device that clamps and fixes the printed circuit board to the board support, a solder bump pattern provided on a board surface of the printed circuit board being brought into contact with an obverse surface of the board support at a portion clamped by the clamping device to electrically conduct with the board support,
   wherein the clamping device is a headed clamp screw, the solder bump pattern being provided around a periphery of a screw insertion hole provided in a corner portion of the printed circuit board, a cantilevered supporting piece having a reference supporting surface for restricting a reference position of the printed circuit board being provided integrally with the board support constituted by a chassis, a cantilevered clamping piece formed by punching the supporting piece being disposed on a lower side of the supporting piece, the supporting piece being provided with a reinforcing rib to reinforce the supporting piece, a recessed notched portion being provided in a root portion of the clamping piece to narrow an effective width of the root portion, and deformation resistance strength of the clamping piece is made weaker than the deformation resistance strength of the supporting piece, and
   wherein the headed clamp screw inserted in the screw insertion hole of the printed circuit board in which a periphery of a portion where the solder bump pattern is formed is placed on the reference supporting surface is inserted and tightened in a threaded hole provided in the clamping piece, and the clamping piece is deformably brought into pressure contact with the solder bump pattern disposed through an opening, which is formed as a punched space of the clamping piece formed in the supporting piece, by means of a tightening force thereof.

2. A printed circuit board supporting structure comprising:
   a printed circuit board;
   a board support constituted by a conductor; and
   a clamping device that clamps and fixes the printed circuit board to the board support, a solder bump pattern provided on a board surface of the printed circuit board being brought into contact with an obverse surface of the board support at a portion clamped by the clamping device to electrically conduct with the board support,
   wherein a portion adjacent to a portion where the solder bump pattern is formed on the printed circuit board is placed on a reference supporting surface provided in continuation from the board support and adapted to restrict a reference position of the printed circuit board, the portion where the solder bump pattern is formed on the printed circuit board is clamped to a clamping piece provided in continuation from the board support by means of the clamping device, and an obverse surface of the clamping piece is brought into pressure contact with the solder bump pattern by a tightening force thereof.

3. The printed circuit board supporting structure according to claim 2, wherein the clamping piece formed by punching a supporting piece having the reference supporting surface is disposed on a lower side of the supporting piece, and an obverse surface of the clamping piece is brought into pressure contact with the solder bump pattern disposed through an opening, which is formed as a punched space of the clamping piece formed in the supporting piece.

4. The printed circuit board supporting structure according to claim 3, wherein the clamping device is a headed clamp screw, the solder bump pattern is provided around a periphery of a screw insertion hole provided in an end portion of the printed circuit board, and the headed clamp screw inserted in the screw insertion hole is inserted and tightened in a threaded hole provided in the clamping piece, causing the clamping piece to be deformed and brought into pressure contact with the solder bump pattern.

5. The printed circuit board supporting structure according to claim 4, wherein deformation resistance strength of the clamping piece is made weaker than the deformation resistance strength of the supporting piece.

6. The printed circuit board supporting structure according to claim 5, wherein the clamping piece is formed in a cantilevered manner, and a notched portion is provided in a root portion of the clamping piece to adjust an effective width of the root portion, and the deformation resistance strength of the clamping piece is made weaker than the deformation resistance strength of the supporting piece.

7. The printed circuit board supporting structure according to claim 5, wherein the supporting piece is provided with a reinforcing rib to reinforce the supporting piece, and the deformation resistance strength of the clamping piece is made weaker than the deformation resistance strength of the supporting piece.

* * * * *